(12) United States Patent
Lee et al.

(10) Patent No.: US 8,067,276 B2
(45) Date of Patent: Nov. 29, 2011

(54) SEMICONDUCTOR DEVICE AND MANUFACTURING METHOD THEREOF

(75) Inventors: Je-Hun Lee, Seoul (KR); Do-Hyun Kim, Seoul (KR); Tae-Hyung Ihn, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 230 days.

(21) Appl. No.: 12/333,831

(22) Filed: Dec. 12, 2008

(65) Prior Publication Data

US 2010/0123136 A1 May 20, 2010

(30) Foreign Application Priority Data

May 13, 2008 (KR) .................. 10-2008-0044144

(51) Int. Cl.
*H01L 21/00* (2006.01)

(52) U.S. Cl. . 438/149; 438/104; 438/795; 257/E21.411; 257/E21.413

(58) Field of Classification Search .................. 438/104, 438/149, 795; 257/E21.411, E21.413, E51.005
See application file for complete search history.

(56) References Cited

U.S. PATENT DOCUMENTS

2007/0072439 A1* 3/2007 Akimoto et al. .............. 438/795
2007/0241327 A1* 10/2007 Kim et al. ....................... 257/43

FOREIGN PATENT DOCUMENTS

| JP | 2007123861 | 5/2007 |
| JP | 2007258675 | 10/2007 |
| KR | 1020070103231 | 10/2007 |

OTHER PUBLICATIONS

G V Samsonov,"Tables 1 and 2, excerpted from The Oxide Handbook", New York 1982.

* cited by examiner

Primary Examiner — Michael S Lebentritt
Assistant Examiner — Daniel Whalen
(74) Attorney, Agent, or Firm — H.C. Park & Associates, PLC

(57) ABSTRACT

An oxide or nitride semiconductor layer is formed over a substrate. A first conductive layer including a first element and a second element, and a second conductive layer including the second element are formed over the semiconductor layer. The first element is oxidized or nitrogenized near an interface region between the first conductive layer and the oxide or nitride semiconductor layer by heat treatment or laser irradiation. The Gibbs free energy of oxide formation of the first element is lower than those of the second element or any element in the oxide or nitride semiconductor layer.

7 Claims, 10 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof. More particularly, the present invention relates to a thin film transistor (TFT) including an oxide or nitride semiconductor layer.

2. Discussion of the Background

In a conventional liquid crystal device or electroluminescence display device, a thin film transistor (TFT) may be used as a switching element to select a pixel or a part of pixel. A TFT typically includes an amorphous silicon or crystalline silicon semiconductor layer. A TFT using a crystalline silicon semiconductor layer has higher mobility, for example, 10 to 100 times more, than that of a TFT including an amorphous silicon semiconductor layer.

However, applying crystalline silicon complicates the fabrication process and decreases production yield. The heating temperature for crystallization of a silicon layer is about 550° C. or higher, so it may be difficult to use a flexible substrate made of plastic or something with a low melting point.

To replace an amorphous or crystalline silicon semiconductor layer, an oxide semiconductor layer, which may include zinc oxide (ZnO), has been developed in recent years. The oxide semiconductor layer has higher mobility, around 10 to 100 times higher than that of amorphous silicon (0.2 to 1.0 $cm^2/Vs$) like the crystalline silicon semiconductor layer, and has much favorable properties like transparency and stability against external light.

SUMMARY OF INVENTION

The present invention provides a semiconductor device that may provide for reduced contact resistance.

The present invention also provides a method of manufacturing the semiconductor device.

Additional features of the invention will be set forth in the description which follows, and in part will be apparent from the description, or may be learned by practice of the invention.

The present invention discloses a method of manufacturing a semiconductor device. The method includes forming an oxide semiconductor layer, forming a first conductive layer on the oxide semiconductor layer, and forming a second conductive layer on the first conductive layer. The first conductive layer includes a first element and a second element, and the first element has a Gibbs free energy of oxide formation lower than those of the second element or any element in the oxide semiconductor layer. The second conductive layer includes the second element. The method further includes oxidizing the first element near an interface region between the first conductive layer and the oxide semiconductor layer.

The present invention also discloses a method of manufacturing a semiconductor device. The method includes forming a nitride semiconductor layer, forming a first conductive layer on the nitride semiconductor layer, and forming a second conductive layer on the first conductive layer. The first conductive layer includes a first element and a second element, and the first element has a Gibbs free energy of oxide formation lower than those of the second element or any element in the nitride semiconductor layer. The second conductive layer includes the second element. The method further includes nitrogenizing the first element near an interface region between the first conductive layer and the nitride semiconductor layer.

The present invention also discloses a method of manufacturing a semiconductor device including forming an oxide semiconductor layer over a substrate, forming a first conductive layer including a first element and a second element on the oxide semiconductor layer, forming a second conductive layer including the second element on the first conductive layer, oxidizing the first element at an interface region of the first conductive layer and the oxide semiconductor layer, forming an insulating layer on the second conductive layer, and forming a gate electrode on the insulating layer. The Gibbs free energy of oxide formation of the first element is lower than those of the second element or any element in the oxide semiconductor layer. The gate electrode includes at least one of Al, Ti, Cu, Au, Ag, Mo, Ni, Ta, Zr, Cr, Co, Nb, and W.

The present invention also discloses a method of manufacturing a semiconductor device including forming a gate electrode over a substrate, forming an insulating layer covering the gate electrode, forming an oxide semiconductor layer over the insulating layer, forming a first conductive layer including a first element and a second element on the oxide semiconductor layer, forming a second conductive layer including the second element on the first conductive layer, and oxidizing the first element at an interface region of the first conductive layer and the oxide semiconductor layer. The Gibbs free energy of oxide formation of the first element is lower than those of the second element or any element in the oxide semiconductor layer.

The present invention also discloses a semiconductor device including an oxide semiconductor layer, a first conductive layer on the oxide semiconductor layer and including a second element and an oxidized first element at an interface region of the first conductive layer and the oxide semiconductor layer, and a second conductive layer including the second element and not including the first element on the first conductive layer. The Gibbs free energy of oxide formation of the first element is lower than those of the second element or any element in the oxide semiconductor layer.

The present invention also discloses a semiconductor device including a substrate, an oxide semiconductor layer on the substrate, a first conductive layer on the oxide semiconductor layer and including a second element and an oxidized first element at an interface region of the first conductive layer and the oxide semiconductor layer, a second conductive layer including the second element on the first conductive layer, an insulating layer on the second conductive layer, and a gate electrode on the insulating layer. The Gibbs free energy of oxide formation of the first element is lower than those of the second element or any element in the oxide semiconductor layer. The gate electrode includes at least one of Al, Ti, Cu, Au, Ag, Mo, Ni, Ta, Zr, Cr, Co, Nb, and W.

The present invention also discloses a semiconductor device including a substrate, a gate electrode on a substrate, an insulating layer covering the gate electrode, a semiconductor layer on the insulating layer, a first conductive layer on the semiconductor layer and including a second element and an oxidized first element at an interface of the first conductive layer and the oxide semiconductor layer, and a second conductive layer including the second element on the first conductive layer. The Gibbs free energy of oxide formation of the first element is lower than those of the second element or any element in the oxide semiconductor layer.

It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1A:
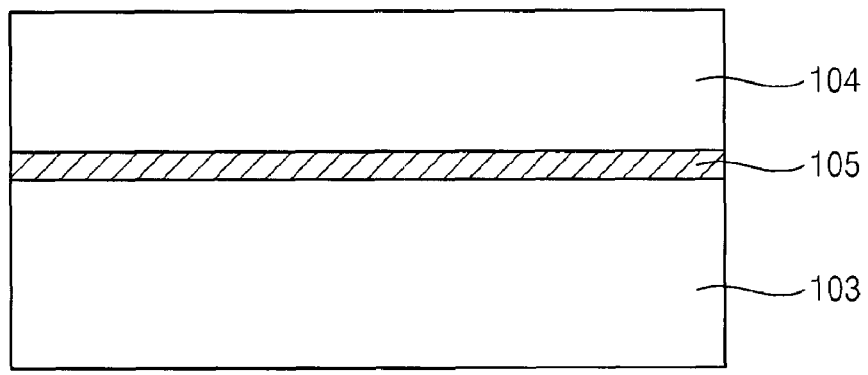
FIG. 1A and FIG. 1B are cross-sectional views showing a process of manufacturing a low resistant contact layer in a semiconductor device according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Exemplary Embodiment 1

FIG. 1A shows a contact layer 105 placed between a semiconductor layer 103 and a wiring 104. In this exemplary embodiment of the invention, a low resistant contact layer 106 (depicted in FIG. 1B) is formed, which may improve the crystallinity of the semiconductor layer 103.

The semiconductor layer 103 in one exemplary embodiment of the invention is highly doped. For example, semiconductor layer 103 may include n+Si on amorphous Si, which may overcome a Schottky barrier to provide a low resistant contact layer between semiconductor layer 103 and wiring 104. This example utilizes the physical principle that contact resistance depends particularly on doping concentration, as described in Equation 1 below.

$$R_c = A \exp[(2\Phi B_n (N/m^* \in s)^{1/2})/\{\hbar coth(q\hbar/2kT (N/m^* \in s)^{1/2})\}] \tag{1}$$

$R_c$ is the contact resistance, N is the doping concentration, $\Phi B_n$ is the barrier height in an energy band diagram, and T is temperature.

However, a highly doped oxide semiconductor layer may not be a low resistant contact layer since solid solubility to generate electron or hole carriers is limited in the oxide semiconductor layer by a doping mechanism. The present exemplary embodiment provides a method for producing a highly conductive non-stoichiometric oxide interlayer 106 between the oxide semiconductor layer 103 and the wiring 104 to lower the barrier height $\Phi B_n$ in Equation 1.

The oxide semiconductor layer 103 may include zinc oxide (ZnO) in an amorphous state, a polycrystalline state, or a microcrystalline state in which both amorphous and polycrystalline states exist, and one or more impurity elements selected from a Group 1 element (for example, lithium (Li), sodium (Na), kalium (K), rubidium (Rb), or cesium (Cs)), a Group 13 element (for example, boron (B), gallium (Ga), indium (In), or thallium (Ti)), a Group 14 element (for example, carbon (C), silicon (Si), germanium (Ge), tin (Sn), or lead (Pb)), a Group 15 element (for example, nitrogen (N), phosphorus (P), arsenic (As), antimony (Sb), or bismuth (Bi)), a Group 17 element (for example, fluorine (F), chlorine (Cl), bromine (Br), or iodine (I)), or the like. Alternatively, the oxide semiconductor layer 103 may include zinc oxide (ZnO) in an amorphous state, a polycrystalline state, or a microcrystalline state in which both amorphous and polycrystalline states exist, without any impurity element. Further, the oxide semiconductor layer 103 may include any of $InGaO_3(ZnO)_5$, magnesium zinc oxide ($Mg_xZn_{1-x}O$), cadmium zinc oxide ($Cd_xZn_{1-x}O$), cadmium oxide (CdO), or an In—Ga—Zn—O based amorphous oxide semiconductor (a-IGZO). However, the base oxide for the oxide semiconductor layer 103 is not confined to a Zn—O compositional system and may instead be an In—O, Sn—O, Ga—O, or Hf—O system. The oxide semiconductor layer 103 may be formed to have a thickness of 25 nm to 500 nm by a sputtering method. The sputtering method may be performed, for example, at a pressure of 0.4 Pa and a flow rate of Ar(argon):$O_2$=50:5. Subsequently, the layer may be etched using fluorinated acid diluted to 0.05%. Unlike an amorphous silicon semiconductor layer, the oxide semiconductor layer 103 may not need to be formed under high vacuum conditions since there is no concern for oxidation. Also, the oxide semiconductor layer may be manufactured inexpensively.

Subsequently, a wiring 104 may be formed on the oxide semiconductor layer 103 by a sputtering method. The wiring 104 may include silver (Ag), aluminum (Al), gold (Au), copper (Cu), or an alloy thereof to provide low resistant conduction. However, at least one alloy element may be added to a wiring element during the initial period of deposition to form an alloyed thin layer 105. For example, when a Ta or Nb alloy element is added to the wiring element, at least one Ta or Nb metal target is prepared in the sputtering system with at least one Al metal target. A shutter on the Ta or Nb target is open for a short time when a shutter of the Al target is open for deposition. For this short time an alloy element, Ta or Nb, and a wiring element, Al, may be co-sputtered and deposited on the substrate 101 to make an alloyed thin layer 105 having a thickness of 5 nm to 50 nm. The wiring 104 is deposited on the alloyed thin layer 105 and has a thickness of 50 nm to 500 nm.

An alloy metal element should be selected by considering constituent elements of the wiring 104 and the oxide semiconductor layer 103. Relative affinity for oxygen atom represented by Gibbs free energy of formation is a design rule of material selection which is described in equation 2.

$$\Delta G_{MOx} \leq \Delta G_{AOx} \text{ or } \Delta G_{COx} \qquad (2)$$

M is an alloying element, A is the wiring 104, C is a cation or impurity element of an oxide semiconductor, and G is the Gibbs free energy, which indicates the thermodynamic potential of chemical compound reaction. The lower the value of the Gibbs free energy formation, the greater the possibility for the formation of oxidation. The Gibbs free energy of oxide formation is shown in the following Table 1 referenced by *The Oxide Handbook, G V Samsonov New York* 1982. For example, if Al is selected for the wiring 104 on a ZnO semiconductor layer 103, Ta or Nb is a suitable element to add to the interface between Al and ZnO. Because a value of the Gibbs free energy of formation for $Al_2O_3$ is "−1492," as shown in Table 1, only $Ta_2O_5$ ("−1910.991") and $Nb_2O_5$ ("−1765") have lower values. These values are also lower than a value for ZnO ("−324"). Note that the comparison of the value of Gibbs free energy of formation must be performed at the same temperature, since it is a function of temperature.

TABLE 1

| | | $\Delta G_f$ (at 298 k): kJ/mol |
|---|---|---|
| Constituent of | ZnO | −324 |
| Oxide semiconductor | $In_2O_3$ | −830 |
| | $Ga_2O_3$ | −998 |
| | $SnO_2$ | −520 |
| | $HfO_2$ | −1088 |
| | $Y_2O_3$ | −1816 |
| Wiring | $Al_2O_3$ | −1492 |
| | CuO | −128 |
| | $Cu_2O$ | −147 |
| | Ag2O | −11.2 |
| Alloying element | $V_2O_5$ | −1419 |
| | $TiO_2$(Rutile) | −889.406 |
| | $TiO_2$ (Anatase) | −883.266 |
| | $Ta_2O_5$ | −1910.991 |
| | $Co_3O_5$ | −794.901 |
| | $MoO_3$ | −667.993 |
| | $Nb_2O_5$ | −1765 |
| | $Mn_2O_3$ | −881.114 |
| | $ZrO_2$ | −1039.724 |
| | MgO | −568.943 |
| | $Cr_2O_3$ | −1058.067 |

Figure 1B:
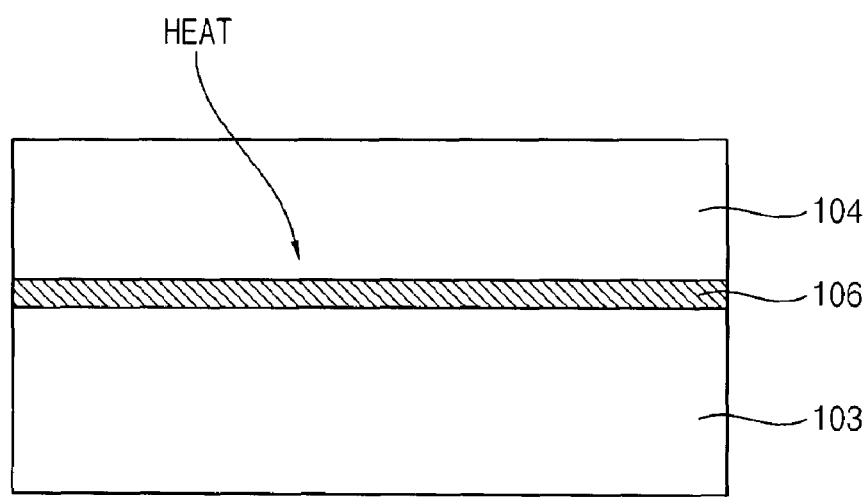

Referring to FIG. 1B, a stacked structure may be heated to a temperature of about 400° C. or less. The heating may be performed in a nitrogen atmosphere or oxygen atmosphere using a general furnace, RTA, laser, or hot plate. For example, the stacked structure may be irradiated by a laser. Crystallinity of the oxide semiconductor layer 103 may be enhanced by such a heating or laser irradiation process. In particular, as set forth by the Gibbs free energy rule, oxygen atoms in oxide semiconductor layer 103 may be attracted to the alloy elements rather than the wiring 104, thereby forming conductive non-stoichiometric amorphous oxide interlayer 106.

Figure 2A:
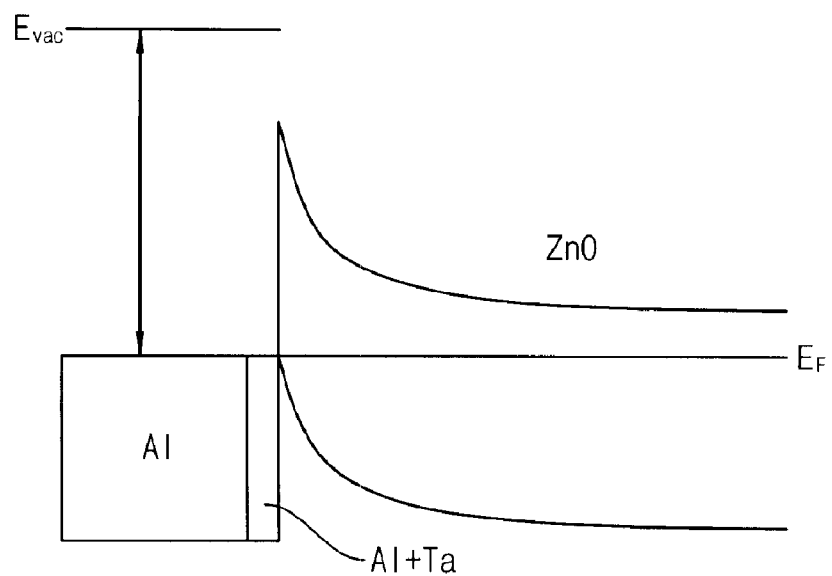
FIG. 2A and FIG. 2B are band diagrams showing a tunneling effect through a low resistant contact layer formed by the manufacturing process shown in FIG. 1A and FIG. 1B.
Figure 2B:
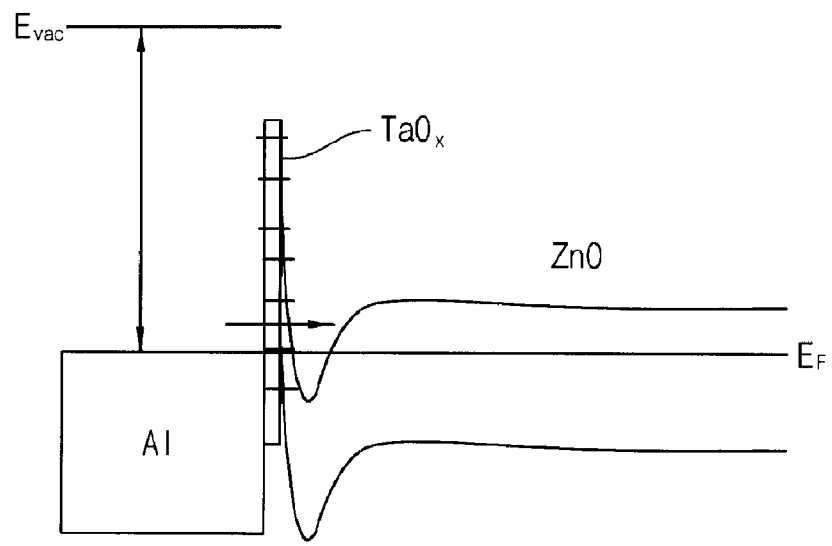

The non-stoichiometric oxide ($MO_x$) interlayer 106 may have a thickness of 0.5 nm to 50 nm with oxygen vacancies that enable electrons to jump to the other side of the layer creating a tunneling effect. FIG. 2A and FIG. 2B are energy band diagrams of the tunneling effect enabled by the formation of the $MO_x$ interlayer. $E_{vac}$ is an energy level of vacuum and $E_F$ is a Fermi energy level that indicates the probability of electron occupation is 50%. When the Al layer contacts the ZnO layer near the alloyed layer of Al and Ta, a barrier is formed at the interface thereof. The barrier is an energy obstacle formed by the electrical contact equalizing the Fermi energy level of the Al and the ZnO, as shown in FIG. 2A. The energy band of the semiconductor layer is bent. The barrier prohibits electrons from jumping across the interface. However, when the Ta elements in the alloyed layer are oxidized by the heat treatment to form non-stoichiometric $TaO_x$ at the interface, an energy well through which electrons may easily jump across may be established.

Exemplary Embodiment 2

In this exemplary embodiment of the invention, a nitride semiconductor layer 103 including a low resistant contact layer 106 is formed and crystallinity may be improved. Exemplary Embodiment 2 is similar to Exemplary Embodiment 1 except for the semiconductor layer 103.

The present exemplary embodiment provides a method for producing a highly conductive non-stoichiometric nitride interlayer 106 between the nitride semiconductor layer 103 and the wiring 104 to lower the barrier height, $\Phi B_n$ in Equation 1.

The nitride semiconductor layer 103 may include gallium nitride (GaN) in an amorphous state, a polycrystalline state, or a microcrystalline state in which both amorphous and polycrystalline states exist, and one or more impurity elements selected from a Group 1 element (for example, lithium (Li), sodium (Na), kalium (K), rubidium (Rb), or cesium (Cs)), a Group 13 element (for example, boron (B), gallium (Ga), indium (In), or thallium (Ti)), a Group 14 element (for example, carbon (C), silicon (Si), germanium (Ge), tin (Sn), or lead (Pb)), a Group 15 element (for example, nitrogen (N), phosphorus (P), arsenic (As), antimony (Sb), or bismuth (Bi)), a Group 17 element (for example, fluorine (F), chlorine (Cl), bromine (Br), or iodine (I)), or the like. Alternatively, the nitride semiconductor layer 103 may include gallium nitride (GaN) in an amorphous state, a polycrystalline state, or a microcrystalline state in which both amorphous and polycrystalline states exist, without any impurity element. However, the base nitride for the nitride semiconductor layer 103 is not confined to a Ga—N compositional system and may instead be an In—N, Zn—N, or Al—N system. The nitride semiconductor layer 103 may be formed to have a thickness of 25 nm to 500 nm by a sputtering method. The sputtering method may be performed, for example, at a pressure of 0.4 Pa and a flow rate of $Ar(argon):N_2=50:5$. Subsequently, the layer may be etched using fluorinated acid diluted to 0.05% by weight. Unlike a semiconductor layer 103 including an amorphous silicon layer, the nitride semiconductor layer 103 may not need to be formed under high vacuum conditions since there is no concern for nitrogenizing. Also, the nitride semiconductor layer 103 may be manufactured inexpensively.

Subsequently, a wiring 104 may be formed on the nitride semiconductor layer 103 through a sputtering method. The wiring 104 may include silver (Ag), aluminum (Al), gold (Au), copper (Cu), or an alloy thereof to provide for low resistant conduction. However, at least one alloy element may be added to a wiring element during the initial period of deposition to form an alloyed thin layer 105. For example, when a Ti or Mg alloy element is added to the Al wiring, at least one Ti or Mg metal target is prepared in the sputtering system with at least one Al metal target. A shutter on the Ti or Mg target is open for a short time when a shutter of the Al target is open for deposition. For this short time the alloy element, Ti or Mg, and wiring element, Al, are co-sputtered and deposited on the substrate 101 to make the alloyed thin layer 105, which may have a thickness of 5 nm to 50 nm. The Al wiring 104 is deposited on the alloyed thin layer 105 and may have a thickness of 50 nm to 500 nm.

An alloy metal element should be selected in consideration of constituent elements of the wiring 104 and the nitride semiconductor layer 103. Relative affinity for oxygen atoms represented by the Gibbs free energy of formation is a design rule of material selection, which is described in Equation 3.

$$\Delta G_{MNx} \leq \Delta G_{ANx} \text{ or } \Delta G_{CNx} \quad (3)$$

M is an alloying element, A is the wiring 104, C is a cation or impurity element of a nitride semiconductor, and G is the Gibbs free energy. The lower the value of the Gibbs free energy of formation, the greater the possibility for the formation of the oxidation. Gibbs free energy of oxide formation is shown in the following Table 2 referenced by *The Oxide Handbook, G V Samsonov New York* 1982. For example, if Al is selected for the wiring 104 on a ZnN semiconductor, Ti or Mg may be suitable as the alloying element added to the interface between Al and GaN. Because a value of the Gibbs free energy of formation for AlN is "−286.9," as shown in Table 2, only TiN ("−309.15") and $Mg_3N_2$ ("−400.49") have lower values. These values are also lower than a value for GaN ("−77.7").

TABLE 2

|  |  | $\Delta G_f$ (at 298 k): kJ/mol |
|---|---|---|
| Constituent of | Zn3N2 | 39.3 |
| Nitride | InN | 15.6 |
| semiconductor | GaN | −77.7 |
|  | YN | −268 |
| Wiring | AlN | −286.997 |
| Alloying element | VN | −191 |
|  | TiN | −309.155 |
|  | TaN | −226.575 |
|  | Mo2N | −54.81 |
|  | Nb2N | −220 |
|  | Mn4N | −104.527 |
|  | ZrN | −336 |
|  | Mg3N2 | −400.498 |
|  | Cr2N | −102 |

Referring to FIG. 1B, a stacked structure may be heated to a temperature of about 400° C. or less. The heating may be performed in a nitrogen atmosphere using a general furnace, RTA, laser, or hot plate. For example, the stacked structure may be irradiated by a laser. Crystallinity of the nitride semiconductor layer 103 is enhanced by such a heating or laser irradiation process. In particular, as designed by the Gibbs free energy rule, nitrogen atoms in the nitride semiconductor layer 103 may be attracted to the alloy elements rather than the wiring 104 to form the conductive non-stoichiometric amorphous nitride layer 106. The non-stoichiometric nitride interlayer 106, $MN_x$, may have a thickness of 0.5 nm to 50 nm with nitrogen vacancies to enable electrons to jump to the other side of the layer creating a tunneling effect.

Exemplary Embodiment 3

A semiconductor device including a field effective thin layer transistor is shown in the following exemplary embodiment. The steps in a process of manufacturing the device are shown in FIG. 3A, FIG. 3B, FIG. 3C, FIG. 3D, FIG. 3E, FIG. 3F, FIG. 3G, and FIG. 3H.

Figure 3A:
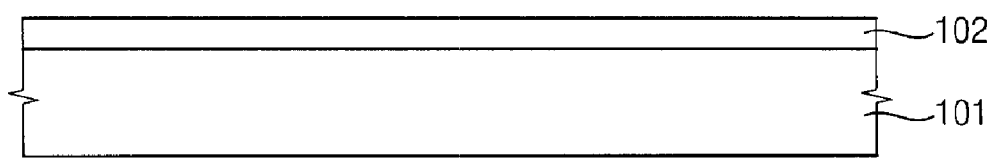
FIG. 3A, FIG. 3B, FIG. 3C, FIG. 3D, FIG. 3E, FIG. 3F, FIG. 3G, and FIG. 3H are cross-sectional views of steps in a process of manufacturing a semiconductor device according to an exemplary embodiment of the present invention.

Referring to FIG. 3A, a substrate 101 may include barium borosilicate glass, alumino borosilicate glass, or the like. Alternatively, the substrate 101 may be a plastic substrate or a resin substrate including polyethylene terephthalate (PET), polyethylene naphthalate (PEN), polyether sulfone (PES), acrylic, polyimide, or the like.

A base layer 102 is formed on the substrate 101. The base layer 102 may be an insulating layer, such as a silicon oxide layer, a silicon nitride layer, a silicon oxynitride layer, or stacked layers thereof. The base layer 102 may be formed by a sputtering method or a CVD method. Note that the base layer 102 may be omitted.

Figure 3B:
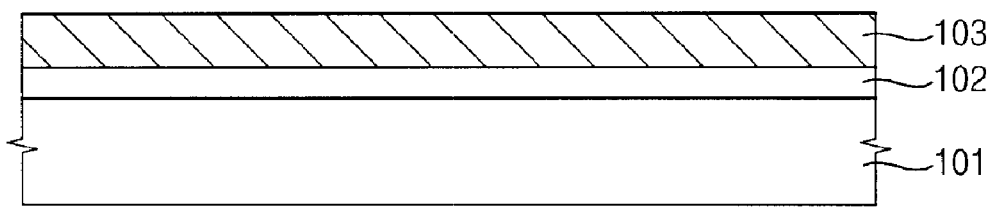

Referring to FIG. 3B, an oxide semiconductor layer 103 may be formed on the base layer 102 to have a thickness of 25 nm to 500 nm by a sputtering method. The oxide semiconductor layer 103 may include zinc oxide (ZnO), $InGaO_3(ZnO)_5$, magnesium zinc oxide ($Mg_xZn_{1-x}O$), cadmium zinc oxide ($Cd_xZn_{1-x}O$), cadmium oxide (CdO), or an In—Ga—Zn—O based amorphous oxide semiconductor (a-IGZO), or the like, which is in an amorphous state, a polycrystalline state, or a microcrystalline state in which both amorphous and polycrystalline states exist. However, the base oxide for the oxide semiconductor layer 103 is not confined to Zn—O compositional system and may instead by an In—O, Sn—O, Ga—O, or Hf—O system.

Figure 3C:
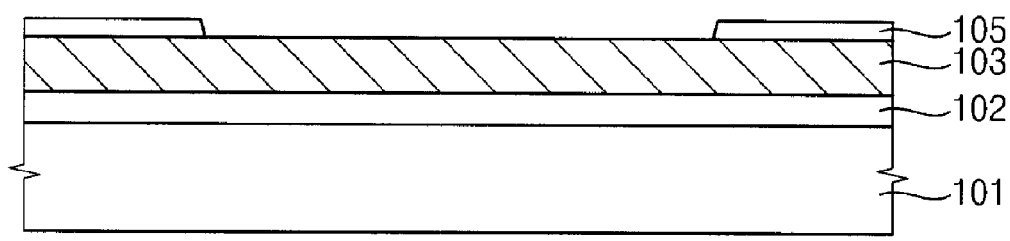
Figure 3D:
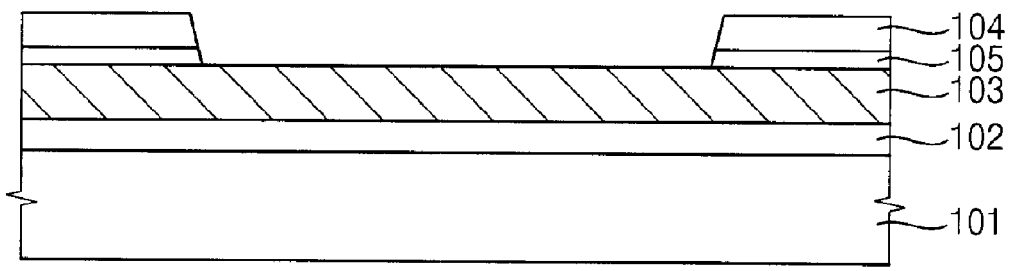

Silver (Ag), aluminum (Al), gold (Au), copper (Cu), or an alloy thereof, may be co-sputtered with an alloy element for a short time onto the oxide semiconductor layer 103 to make a very thin mixture layer 105, as shown in FIG. 3C. As shown in FIG. 3D, a wiring 104, which may include silver (Ag), aluminum (Al), gold (Au), copper (Cu), or an alloy thereof, is formed on the mixture layer 105 and may have a thickness of 50 nm to 500 nm without breaking the atmosphere of the sputtering chamber.

Figure 3E:
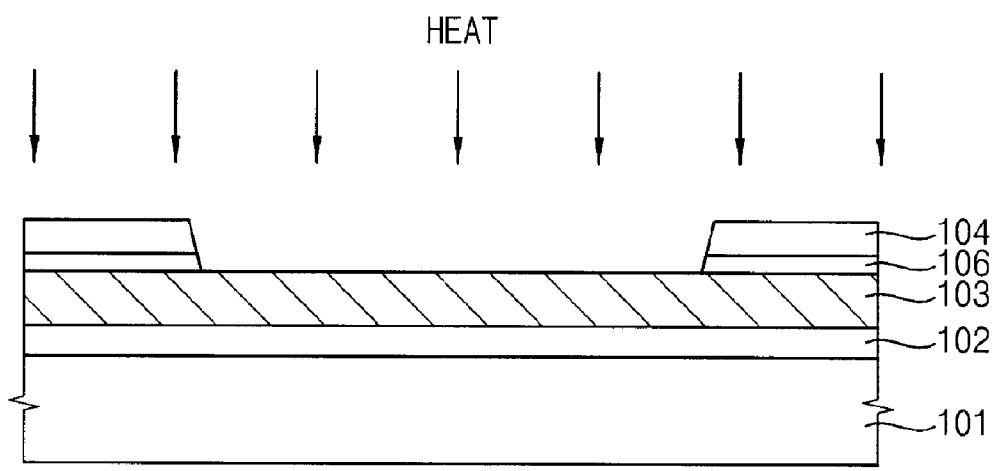

Referring to FIG. 3E, the stacked structure may be heated to a temperature of about 400° C. or less. The heating may be performed in a nitrogen atmosphere using a general furnace, RTA, laser, or hot plate. For example, the stacked structure may be irradiated by a laser. The mixture layer 105 may be changed to a conductive amorphous oxide layer 106, $MO_x$, which has defects inside that enable electrons to jump creating a tunneling effect.

Figure 3F:
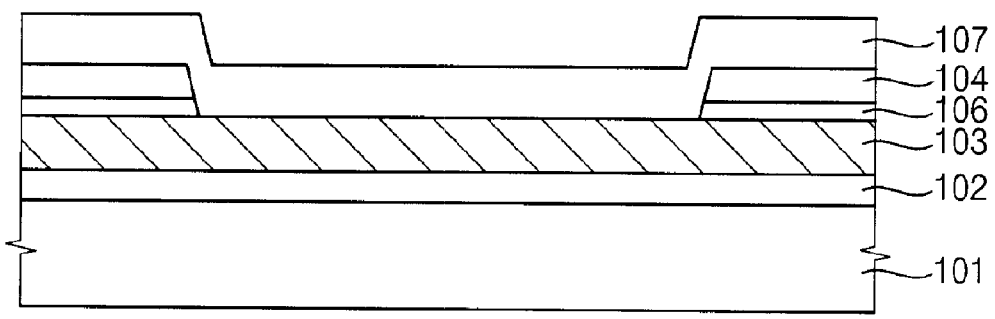

Referring to FIG. 3F, a gate insulating layer 107, which may have a thickness of about 50 nm to 500 nm, is formed on the oxide semiconductor layer 103. The gate insulating layer 107 may be formed to have a single layer structure, which includes a layer containing an oxide of silicon or a nitride of silicon, or a stacked layer structure by a sputtering method or a variety of CVD methods, such as a plasma CVD method. The gate insulating layer 107 may include one or more materials having favorable compatibility with the oxide semiconductor layer 103, such as alumina ($Al_2O_3$), aluminum nitride (AlN), titanium oxide ($TiO_2$), zirconia ($ZrO_2$), lithium oxide ($Li_2O$), potassium oxide ($K_2O$), sodium oxide ($Na_2O$), indium oxide ($In_2O_3$), yttrium oxide ($Y_2O_3$), or calcium zirconate ($CaZrO_3$). The gate insulating layer 107 may be a single layer or two or more stacked layers.

Figure 3G:
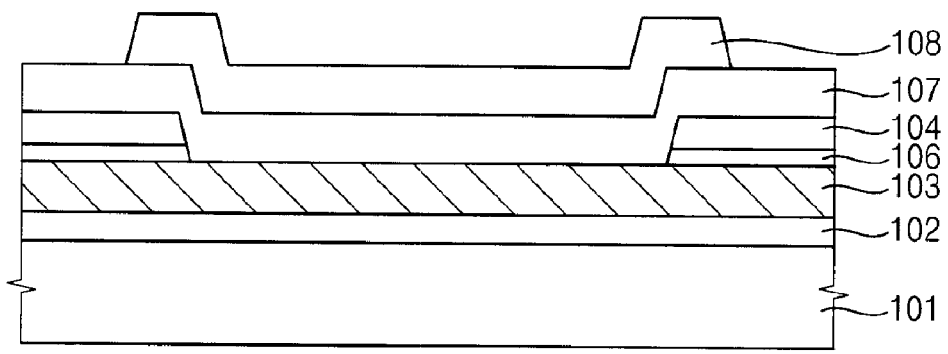

Next, a gate electrode 108 is formed on the gate insulating layer 107, as shown in FIG. 3G. The gate electrode 108, which may have a thickness of 100 nm to 200 nm, may be formed by a sputtering method. The gate electrode 108 may include silver (Ag), aluminum (Al), gold (Au), copper (Cu) or tantalum (Ta), tungsten (W), titanium (Ti), molybdenum (Mo), chromium (Cr), niobium (Nb), or an alloy material or a multi layer mainly containing one more of these elements. Further, the gate electrode 108 may also include a semiconductor material typified by polycrystalline silicon doped with an impurity element, such as phosphorous.

Figure 3H:
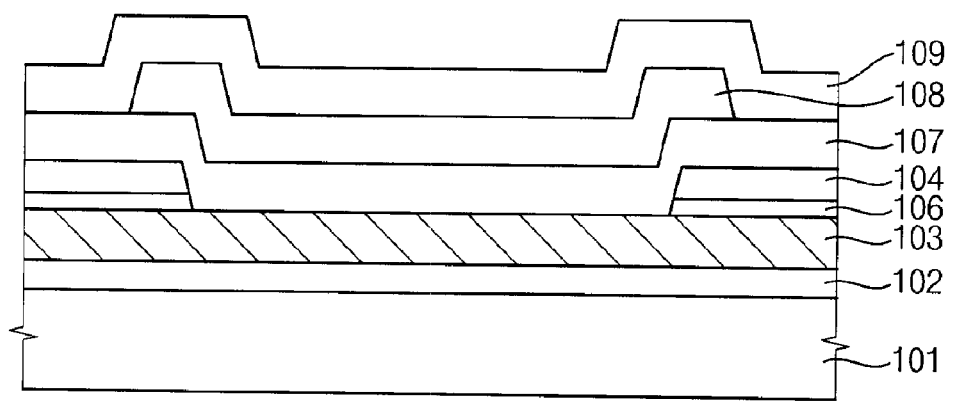

Referring to FIG. 3H, a passivation layer 109 may be formed to cover the stacked structure by a thin layer method, such as a plasma CVD method or a sputtering method. The passivation layer 109 may include an insulating material, such as silicon nitride, silicon oxide, silicon nitride oxide, silicon oxynitride, aluminum oxynitride, aluminum oxide, diamond-like carbon (DLC), nitrogen-containing carbon (CN), or the like. The passivation layer 109 is not limited to a single layer, and instead two or more layers may be provided.

Exemplary Embodiment 4

An exemplary embodiment of the invention is explained with reference to FIG. 4A, FIG. 4B, FIG. 4C, FIG. 4D, FIG. 4E, and FIG. 4F. Exemplary Embodiment 4 explains a method of forming a reverse stagger type TFT with a pixel portion on a substrate in which a storage capacitor is connected to the TFT. Further, a terminal section, which is formed in an edge portion of a substrate to electrically connect to the wirings of circuits formed on another substrate, is manufactured simultaneously.

Figure 4A:
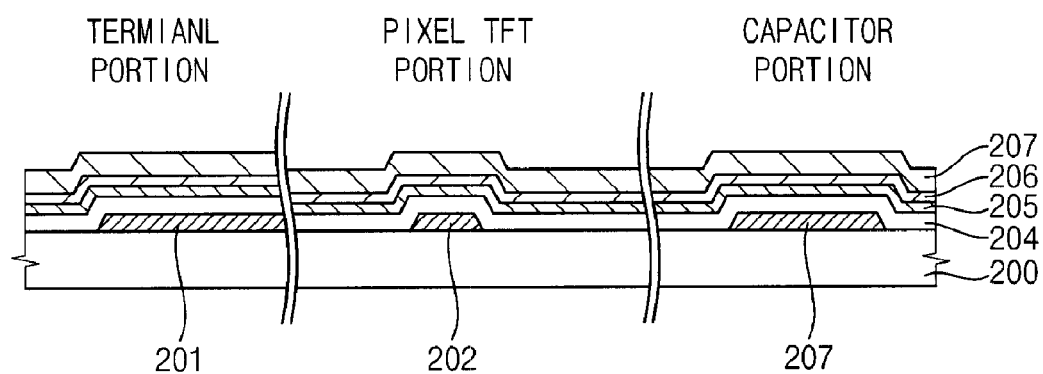
FIG. 4A, FIG. 4B, FIG. 4C, FIG. 4D, FIG. 4E, and FIG. 4F are cross-sectional views of steps in a process of manufacturing a display panel including a semiconductor device according to an exemplary embodiment of the present invention.

Referring to FIG. 4A, a substrate 200 may include a material such as barium borosilicate glass or aluminum borosilicate glass. Alternatively, the substrate 200 may be a translucent substrate, such as a quartz substrate or a plastic substrate.

After forming a conductive layer over the entire surface of the substrate, a first photolithography process is performed, a resist mask is formed, unnecessary portions are removed by etching, and wirings and electrodes (the gate wiring includes a gate electrode 202, a capacitor wiring 203, and a terminal 201) are formed. Then, etching is performed to form a tapered portion in at least an edge portion of the gate electrode 202.

The gate wirings 202, 203, and 201 may include silver (Ag), aluminum (Al), gold (Au), copper (Cu) or tantalum (Ta), tungsten (W), titanium (Ti), molybdenum (Mo), chromium (Cr), niobium (Nb), or an alloy material or a multi layer mainly containing one or more of these elements.

An insulating layer 204 with a thickness of about 50 nm to 500 nm is formed on the entire surface of the substrate 200. The insulating layer 204 may have a single layer structure containing an oxide of silicon or a nitride of silicon, or a stacked layer structure containing an oxide of silicon or a nitride of silicon, by a sputtering method or a variety of CVD methods such as a plasma CVD method. The insulating layer 204 may include at least one material having favorable compatibility with the oxide semiconductor layer such as alumina ($Al_2O_3$), aluminum nitride (AlN), titanium oxide ($TiO_2$), zirconia ($ZrO_2$), lithium oxide ($Li_2O$), potassium oxide ($K_2O$), sodium oxide ($Na_2O$), indium oxide ($In_2O_3$), yttrium oxide ($Y_2O_3$), or calcium zirconate ($CaZrO_3$). The insulating layer 204 may be a single layer or two or more stacked layers.

Next, the oxide semiconductor layer 205, which may have a thickness of 25 nm to 500 nm, is formed over the entire surface of the insulating layer 204 using a method such as plasma CVD or sputtering. The oxide semiconductor layer 205 may include, for example, zinc oxide (ZnO), $InGaO_3(ZnO)_5$, magnesium zinc oxide ($Mg_xZn_{1-x}O$), cadmium zinc oxide ($Cd_xZn_{1-x}O$), cadmium oxide (CdO), or an In—Ga—Zn—O based amorphous oxide semiconductor (a-IGZO), or the like is used, which is in an amorphous state, a polycrystalline state, or a microcrystalline state in which both amorphous and polycrystalline states exist. The base oxide for the oxide semiconductor layer 205 is not confined to a Zn—O compositional system and may instead be an In—O, Sn—O, Ga—O, or Hf—O system.

A wiring material, which may include silver (Ag), aluminum (Al), gold (Au), copper (Cu), or an alloy thereof, may be co-sputtered with an alloy element for short time to make very thin mixture layer 206. The wiring 207, which may include silver (Ag), aluminum (Al), gold (Au), copper (Cu), or an alloy thereof, may be formed on the mixture layer 206 and may have a thickness of 50 nm to 500 nm without breaking the atmosphere of sputtering chamber.

The stacked structure may be heated to a temperature of about 400° C. or less. The heating may be performed in a nitrogen atmosphere using a general furnace, RTA, laser, or hot plate. For example, the stacked structure may be irradiated by a laser. The mixture layer 206 including a wiring material and alloy element is changed to a conductive amorphous oxide layer 206, ($MO_x$), having defects inside that enable electrons to jump creating a tunneling effect.

Figure 4B:
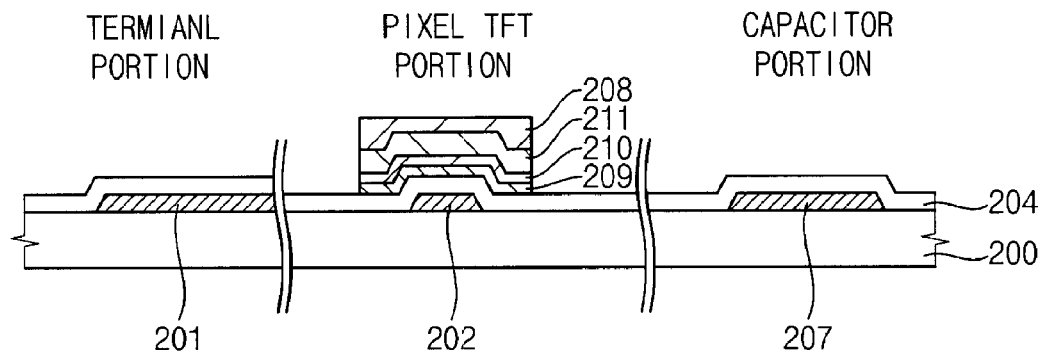

Next, as shown in FIG. 4B, a second photolithography process is performed, a resist mask 208 is formed, and source wiring is formed by removing unnecessary portions by etching. Wet etching or dry etching may be used as the etching process. The oxide semiconductor layer 205, the conductive amorphous oxide layer 206 and the wiring 207 are etched to form an oxide semiconductor layer 209, a low resistant contact interlayer 210, and a conductive metal layer 211, respectively, in the pixel TFT portion. Further, the capacitor wiring 203 and the insulating layer 204 remain in a capacitor portion, and the terminal 201 and the insulating layer 204 remain in the terminal portion. Here, the wiring 207, the oxide semiconductor layer 205 and the conductive amorphous oxide layer 206 are removed, for example, by dry etching using a gas mixture of $SiCl_4$, $Cl_2$, and $BCl_3$ or a gas mixture of $CF_4$ and $O_2$.

Figure 4C:
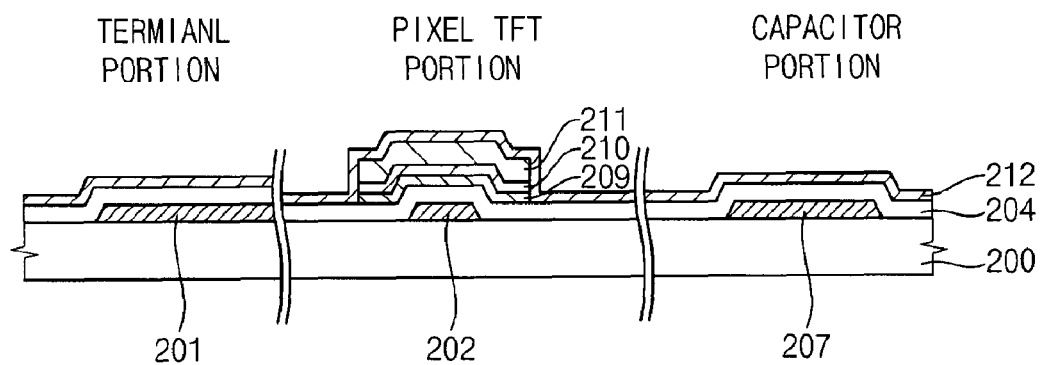

Next, referring to FIG. 4C, after removing the resist mask 208, a transparent conductive layer 212 is deposited over the entire surface of the substrate 200. This transparent conductive layer 212 may include a material such as indium oxide (In 203) or indium oxide tin oxide alloy ($In_2O_3$—$SnO_2$, abbreviated as ITO) using a method such as sputtering or vacuum evaporation. The etching process for this type of material may be performed using a solution of hydrochloric acid. However, a residue may be easily generated, particularly by ITO etching, and therefore an indium oxide zinc oxide alloy ($In_2O_3$—ZnO, abbreviated as IZO) may be used to improve the etching workability.

Figure 4D:
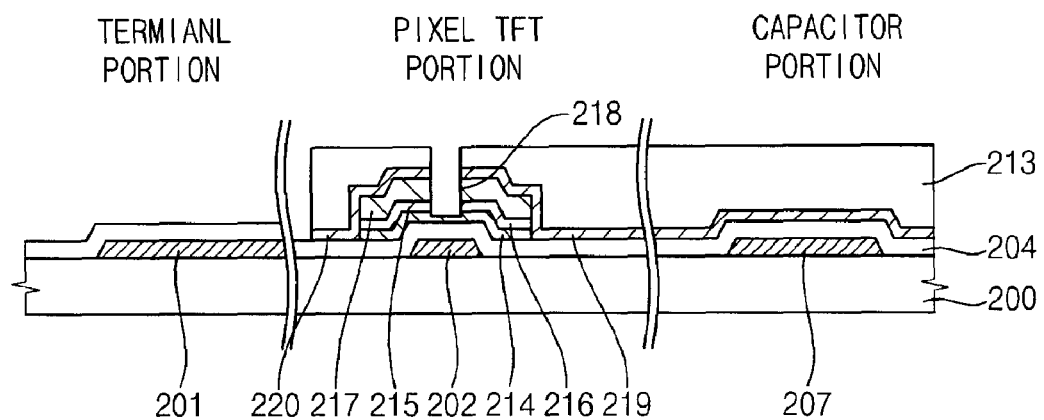

Referring to FIG. 4D, a resist mask 213 is formed by a third photolithography process. Unnecessary portions are then removed by etching to form an amorphous semiconductor layer 214, a source region 215, a drain region 216, the source electrode 217, the drain electrode 218, and the pixel electrode 219. The third photolithography process patterns the transparent conductive layer 212, and at the same time removes a part of the conductive metal layer 211, the low resistant contact interlayer 210, and the oxide semiconductor layer 209 to form an opening.

In Exemplary Embodiment 4, the pixel electrode 219, which may be made from ITO, is selectively removed first by wet etching using a nitric acid and hydrochloric acid solution or a ferric chloride solution, and a portion of the conductive metal layer 211, the low resistant contact interlayer 210, and the oxide semiconductor layer 209 are etched by dry etching. Note that wet etching and dry etching are used in Exemplary Embodiment 4, but the operator may perform only dry etching with a suitable reaction gas, or the operator may perform only wet etching with a suitable reaction solution.

The lower portion of the opening reaches a concave portion formed in the amorphous semiconductor layer 214. The conductive metal layer 211 includes the source wiring 217 and the drain electrode 218, which are separated by the opening, and the low resistant contact interlayer 210 includes the source region 215 and the drain region 216. Furthermore, the transparent conductive layer 220 contacts the source electrode 217 and covers the source wiring, and during subsequent manufacturing processes, especially during a rubbing process, may prevent the development of static electricity. An example of forming the transparent conductive layer 220 on the source wiring was shown in Exemplary Embodiment 1, but the transparent conductive layer 220 may also be removed during the etching of the ITO layer. Further, a circuit for protection from static electricity may be formed by utilizing the above ITO layer, in the etching of the ITO layer.

Moreover, a storage capacitor is formed in the third photolithography process by the capacitor wiring 203 and the pixel electrode 219, with the insulating layer 204 in the capacitor portion as a dielectric. In addition, the transparent conductive layer 220 formed in the terminal portion is removed by the third photolithography process.

Figure 4E:
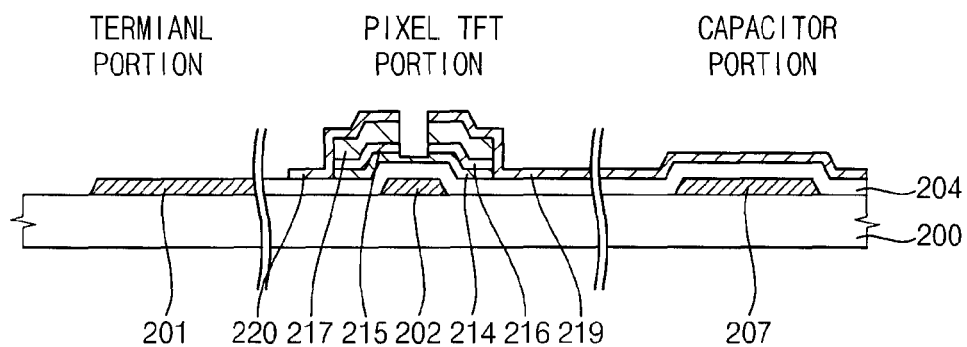
Figure 5:
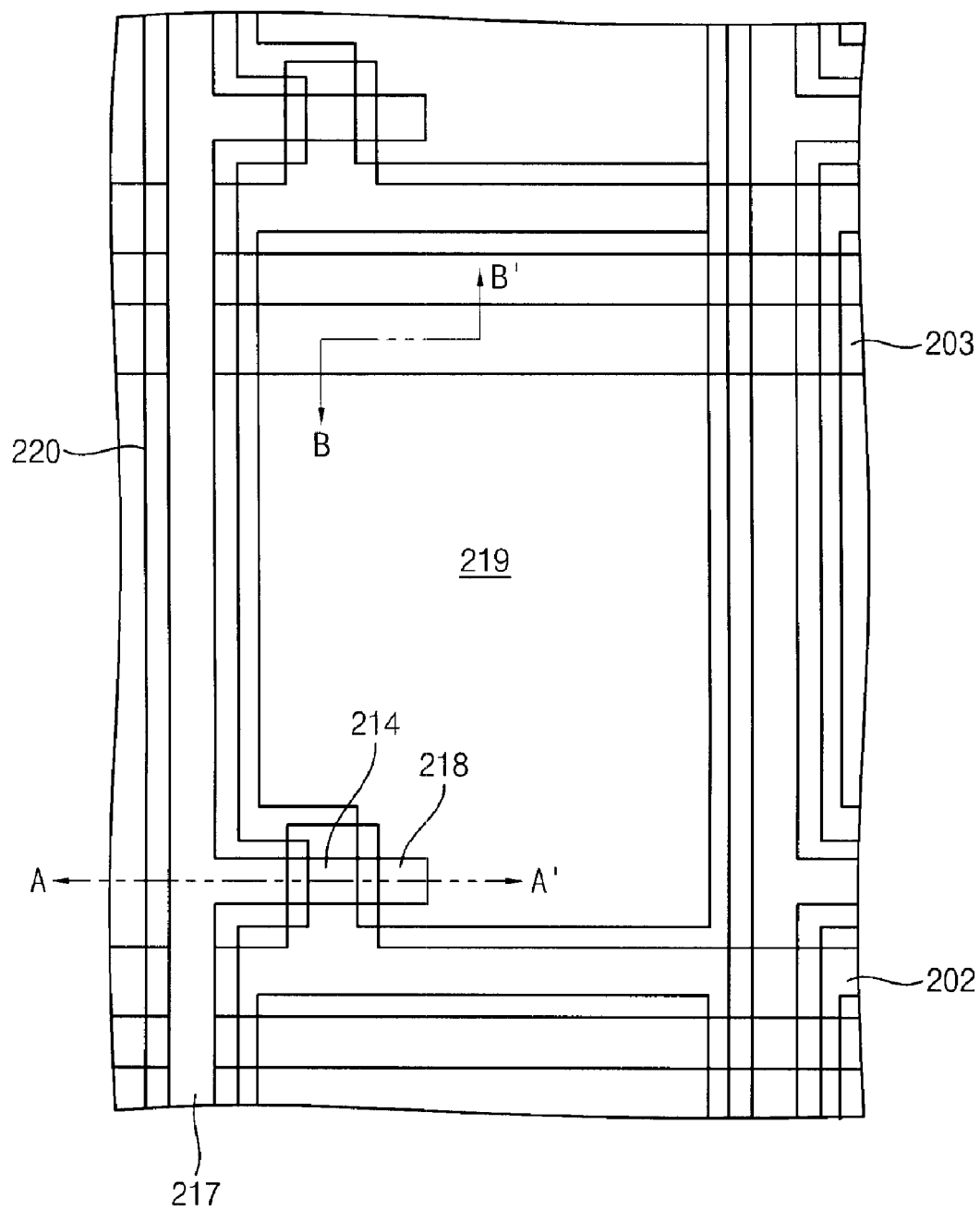
FIG. 5 is a diagram of a pixel design of a display panel according to an exemplary embodiment of the present invention.

Next, referring to FIG. 4E, after removing the resist mask 213, a resist mask is formed by using a shadow mask, and the insulating layer 204 which covers the terminal 201 of the terminal portion is selectively removed. In addition, the resist mask may also be formed by screen printing in place of the shadow mask. Note that FIG. 5 is a top view of one pixel, and FIG. 4E corresponds to cross sections taken along the lines A-A' and B-B'.

Thus, by using three photo-masks and performing three photolithography processes, the pixel TFT portion having the reverse stagger type n-channel TFT and the storage capacitor may be completed. By placing these in a matrix state corresponding to each pixel and thus composing the pixel portion, one substrate of an active matrix liquid crystal display device can be manufactured. For convenience, this type of substrate is referred to as an active matrix substrate throughout this specification.

Figure 4F:
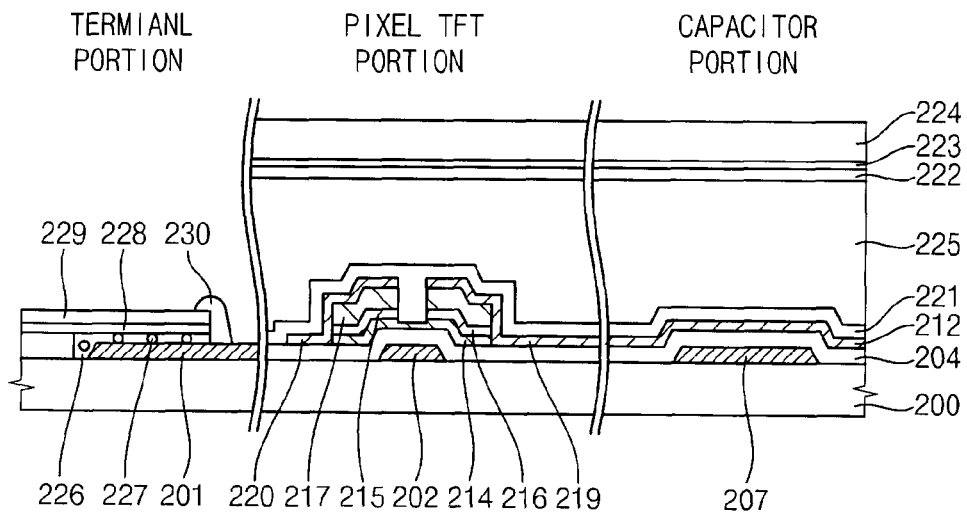

Referring to FIG. 4F, an alignment layer 221 is selectively formed next in only the pixel portion of the active matrix substrate. Screen printing may be used as a method of selectively forming the alignment layer 221, and a method of removal in which a resist mask is formed using a shadow mask after application of the alignment layer may also be used. A polyimide resin may be used in the alignment layer 221 of the liquid crystal display element. Note that though the present Exemplary Embodiment showed an example of forming the alignment layer 221 after selectively removing the insulating layer 204 that covers the terminal 201 of the terminal portion, the insulating layer 204 and the alignment layer 221 in the terminal portion may be removed simultaneously after laminating the alignment layer 221 on the insulating layer 204 that covers the terminal 201 of the terminal portion.

The active matrix substrate and an opposing substrate 224, on which an opposing electrode 223 and an alignment layer 222 are formed, are joined together by a sealant while maintaining a gap between the substrates using spacers (not shown). Then, a liquid crystal material 225 is injected into the space between the active matrix substrate and the opposing substrate 224. Any suitable material may be used as the liquid crystal material 225, for example, a TN liquid crystal material may be used. After injecting the liquid crystal material 225, the injecting entrance is sealed by a resin material.

Next, a flexible printed circuit (FPC) is connected to the terminal 201 of the terminal portion. The FPC includes a copper wiring 228 on an organic resin layer 229, which may include polyimide, and is connected to the input terminal 201 by an anisotropic conductive adhesive. The anisotropic conductive adhesive includes an adhesive 226 and particles 227, and may have a diameter of several tens to several hundred of μm and may have a conductive surface plated by a material, such as gold, which is mixed therein. The particles 227 form an electrical connection in this portion by connecting the input terminal 201 and the copper wiring 228. In addition, to increase the mechanical strength of this region, a resin layer 230 may be formed.

This Exemplary Embodiment can be combined with Exemplary Embodiment 1, Exemplary Embodiment 2, or Exemplary Embodiment 3.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a semiconductor device, the method comprising;
   forming an oxide semiconductor layer;
   forming a first conductive layer on the oxide semiconductor layer, the first conductive layer comprising an alloy of first and second elements, the first element having a Gibbs free energy of oxide formation lower than those of the second element or any element in the oxide semiconductor layer;
   forming a second conductive layer on the first conductive layer, the second conductive layer comprising the second element; and
   oxidizing the first element near an interface region between the first conductive layer and the oxide semiconductor layer.

2. The method of claim 1, wherein oxidizing the first element comprises heat treating the first element.

3. The method of claim 1, oxidizing the first element comprises irradiating the first element with a laser.

4. The method of claim 1, wherein the first element comprises at least one of Al, Ti, Cu, Au, Ag, Mo, Ni, Ta, Zr, Cr, Co, and W.

5. The method of claim 1, wherein the oxide semiconductor layer comprises at least one of zinc oxide, cadmium oxide, indium oxide, tin oxide, and hafnium oxide.

6. The method of claim 1, wherein the oxide semiconductor layer comprises at least one of Li, Na, K, Rb, Cs, Be, Mg, Ca, B, Ga, In, Ti, C, Si, Ge, Sn, Pb, N, P, As, Sb, Bi, F, CI, Br, and I.

7. A method of manufacturing a semiconductor device, the method comprising;
   forming an oxide semiconductor layer over a substrate;
   forming a first conductive layer on the oxide semiconductor layer, the first conductive layer comprising an alloy of first and second elements, the first element having a Gibbs free energy of oxide formation lower than those of the second element or any element in the oxide semiconductor layer;
   forming a second conductive layer on the first conductive layer, the second conductive layer comprising the second element; and
   oxidizing the first element near a region of interface between the first conductive layer and the oxide semiconductor layer;
   forming an insulating layer on the second conductive layer; and
   forming a gate electrode on the insulating layer,
   wherein the gate electrode comprises at least one of Al, Ti, Cu, Au, Ag, Mo, Ni, Ta, Zr, Cr, Co, Nb, and W.

* * * * *